United States Patent [19]
Suzuki

[11] Patent Number: 5,268,873
[45] Date of Patent: Dec. 7, 1993

[54] SEMICONDUCTOR MEMORY APPARATUS

[75] Inventor: Kouichi Suzuki, Kanagawa, Japan

[73] Assignee: NEC Corporation, Tokyo, Japan

[21] Appl. No.: 837,232

[22] Filed: Feb. 14, 1992

[30] Foreign Application Priority Data

Feb. 15, 1991 [JP] Japan .................................. 3-042980

[51] Int. Cl.$^5$ .......................................... G11C 11/413
[52] U.S. Cl. .............................. 365/233.5; 365/189.05; 365/230.08
[58] Field of Search ............. 365/233.5, 189.05, 230.08

[56] References Cited

U.S. PATENT DOCUMENTS 4,537,147 2/1986 Aoyama et al. ................... 365/233.5
4,982,366 1/1991 Takemae ....................... 365/233.5 X Primary Examiner—Eugene R. LaRoche
Assistant Examiner—Do Hyun Too
Attorney, Agent, or Firm—Laff, Whitesel, Conte & Saret

[57] ABSTRACT

A ROM apparatus includes a control circuit for controlling an output buffer to be turned into a high impedance state or an off state for a predetermined time in response to a change of an address signal. For this control circuit, a supply of data read from a wrong address of a memory to an external circuit is prohibited for a duration of a false malfunction which is caused by a precharge of digit lines.

2 Claims, 4 Drawing Sheets

SEMICONDUCTOR MEMORY APPARATUS

FIELD OF THE INVENTION

This invention relates to a semiconductor memory apparatus, and more particularly to, a semiconductor memory apparatus prohibiting the data output from a wrong address.

BACKGROUND OF THE INVENTION

A ROM (read only memory) is generally classified by a synchronous type and an asynchronous type, among which the synchronous type is widely used because of the convenience without the necessity of a synchronous signal.

A conventional semiconductor memory apparatus of an asynchronous type includes an address buffer for supplying an address signal composed of X and Y coordinate addresses, an X-decoder for decoding the X coordinate address to designate an X line address of a matrix memory for storing predetermined data, a Y-selector for selecting data on the X line in accordance with the Y coordinate address supplied from the address buffer, a sense amplifier for amplifying the selected data to generate logical data, and an output buffer for holding and supplying the logical output data.

In operation, when an address signal is supplied to the address buffer, X and Y coordinate addresses are supplied to the X-decoder and the Y-selector, respectively. An X line of the memory corresponding to the X coordinate address is designated to supply data to the Y-selector, in which data are selected by the Y coordinate address, and from which the selected data are supplied to the sense amplifier. The data are amplified in the sense amplifier to be supplied to the output buffer, in which the read data are held to be supplied to an output stage.

However, the conventional semiconductor memory apparatus has a disadvantage in that data of a wrong address tends to be read from the memory, because the wrong address is to be generated in accordance with the influence of the momentary change of power supply and ground level to the address buffer. In more detail, when an address signal is changed, digit lines are precharged. In this occasion, there is a possibility that a false malfunction occurs in the sense amplifier. That is, the sense amplifier supplies data of a wrong address to the output buffer due to the precharge of the digit lines.

SUMMARY OF THE INVENTION

Accordingly, it is an object of the invention to provide a semiconductor memory apparatus in which the supply of a wrong output data can be prevented.

According to the invention, a semiconductor memory apparatus includes:

a memory having memory cells arranged in a matrix pattern;

means for addressing the memory in accordance with a given address signal;

a sense amplifier for amplifying data read from the memory subsequently to precharge of digit lines;

buffer means for supplying the data to an external circuit;

means for detecting a change of the given address signal to generate an address change signal; and means for controlling the buffer means to prohibit a supply of the data to the external circuit for a predetermined time in response to the address change signal.

BRIEF DESCRIPTION OF THE DRAWINGS

The invention will be explained in more detail in conjunction with appended drawings; wherein.

DESCRIPTION OF THE PREFERRED EMBODIMENTS

Figure 1:
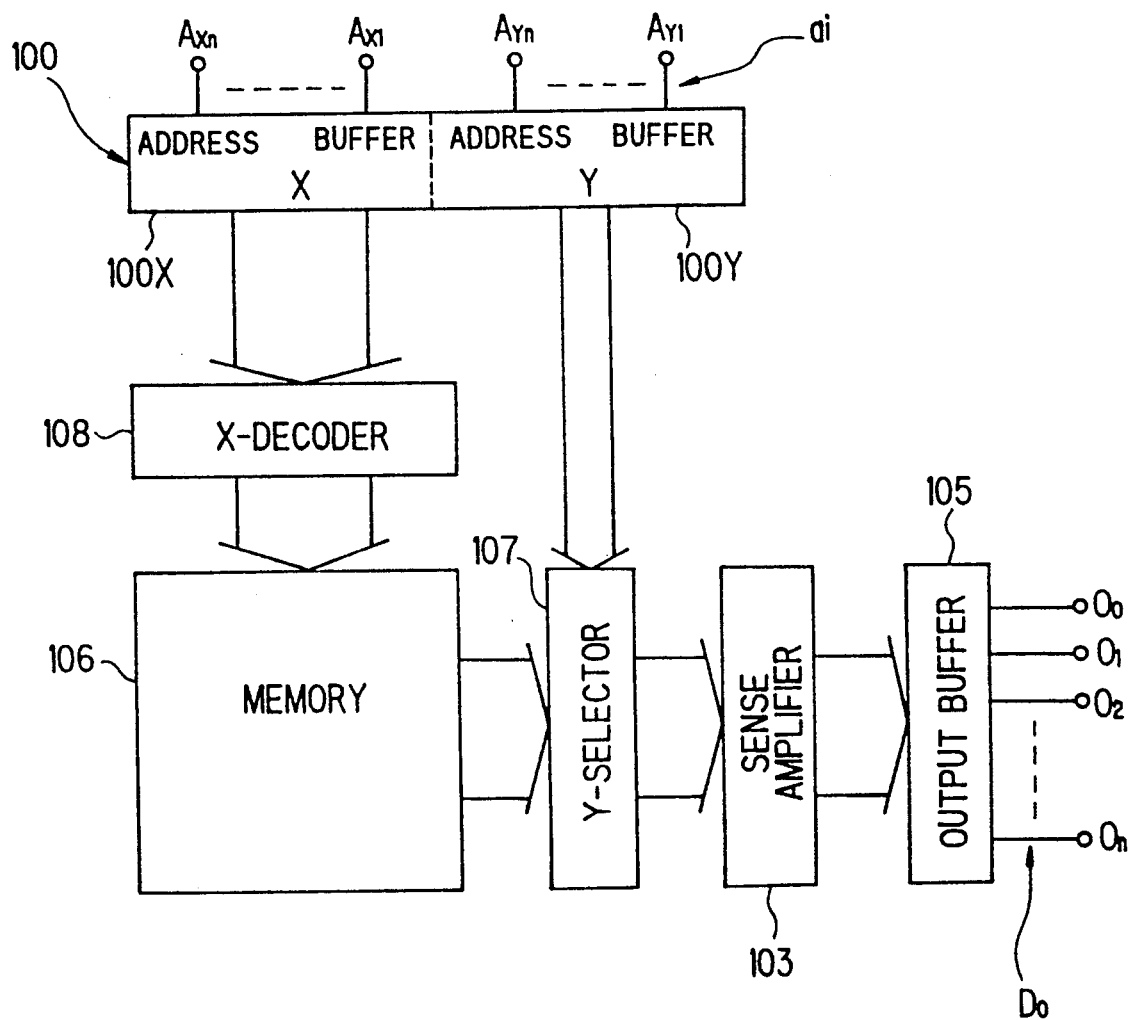
FIG. 1 is a block diagram showing a conventional semiconductor memory apparatus.

Before describing a semiconductor memory apparatus according to the invention, the briefly aforementioned conventional semiconductor memory apparatus will be explained in conjunction with FIG. 1.

A conventional semiconductor memory apparatus of an asynchronous type includes an address buffer 100 composed of an X coordinate address buffer 100X and a Y coordinate address buffer 100Y, an X-decoder 108 connected to the X coordinate address buffer 100X, a memory 106 for storing predetermined data, a Y-selector 107 connected to the Y coordinate address buffer 100Y for selecting data in accordance with a Y coordinate address supplied from the Y coordinate address buffer 100Y, a sense amplifier 103 connected to the Y-selector 107 for amplifying the selected data to generate logical data, and an output buffer connected to the sense amplifier 103.

The X and Y coordinate address buffers 100X and 100Y are provided with address input terminals Ax1 to Axn and Ay1 to Ayn to be supplied with X coordinate address and Y coordinate address separately. The memory 106 is composed of a plurality of matrix memory cell for storing predetermined data, and the output buffer 105 is provided with output terminals $O_0$ to On for supplying an output data "Do".

Next, operation of the conventional semiconductor memory apparatus will be explained in conjunction with FIGS. 2 and 3. When an address signal is supplied to the address buffer 100, an X coordinate address is supplied to the X-decoder 108 in which the X coordinate address is decoded to designate an X line of the memory 106, and Y coordinate address "ai" is supplied to the Y-selector 107, respectively. Then, an X line data corresponding to the X coordinate address is read from the memory 106 to the Y-selector 107. The Y-selector 107 selects data from data on the X line of the memory 106 in accordance with the Y coordinate address "ai", simultaneously with the precharge of digit lines. Then, the selected data is supplied to the sense amplifier 103, in which the data is amplified to be supplied to the output buffer 105. Thus, the read data is held in the output buffer 105 to be supplied to an output stage.

Figure 2:
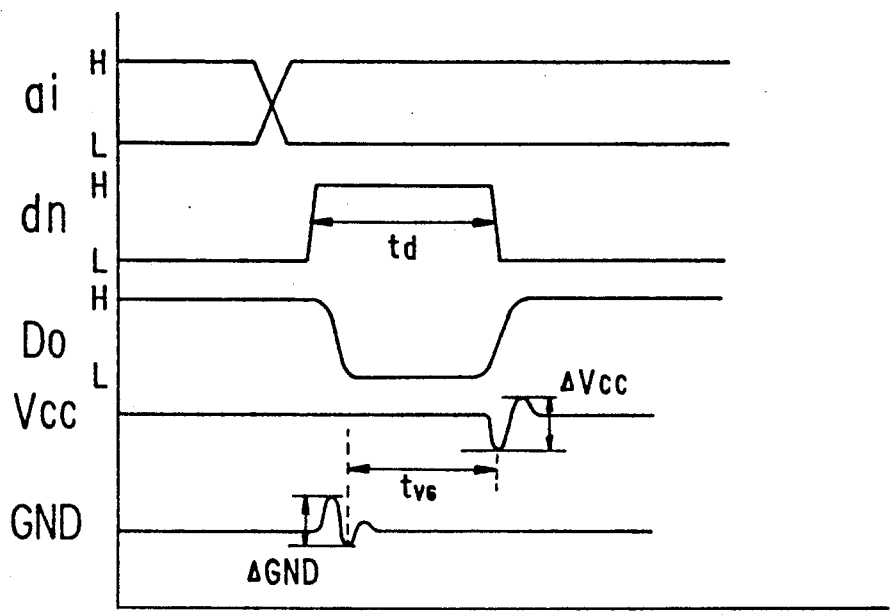
FIGS. 2 and 3 are timing charts showing operation of the conventional semiconductor memory apparatus, respectively.

In the occasion of precharging the digit line in accordance with the charge of the Y coordinate address "ai" as shown in FIG. 2, the sense amplifier 103 tends to supply data of a wrong address to the output buffer 105. This is shown in FIG. 2 by a false malfunction duration "td". As a result, the output data "Do" is erroneously lowered for the duration "td", even if the output data Do should be changed from a high level to a high level. Thus, the change ΔGND occurs on the ground potential GND at the falling time of the output data Do due to the presence of an inductance of the digit lines (L di/dt), and the change ΔVcc occurs on the power supply potential Vcc at the rising time of the output data Do due to the same reason. When the occurrence time difference "$t_{wo}$" (="td") is considerably large, no substantially problem occurs in reading data from the memory 106.

Figure 3:
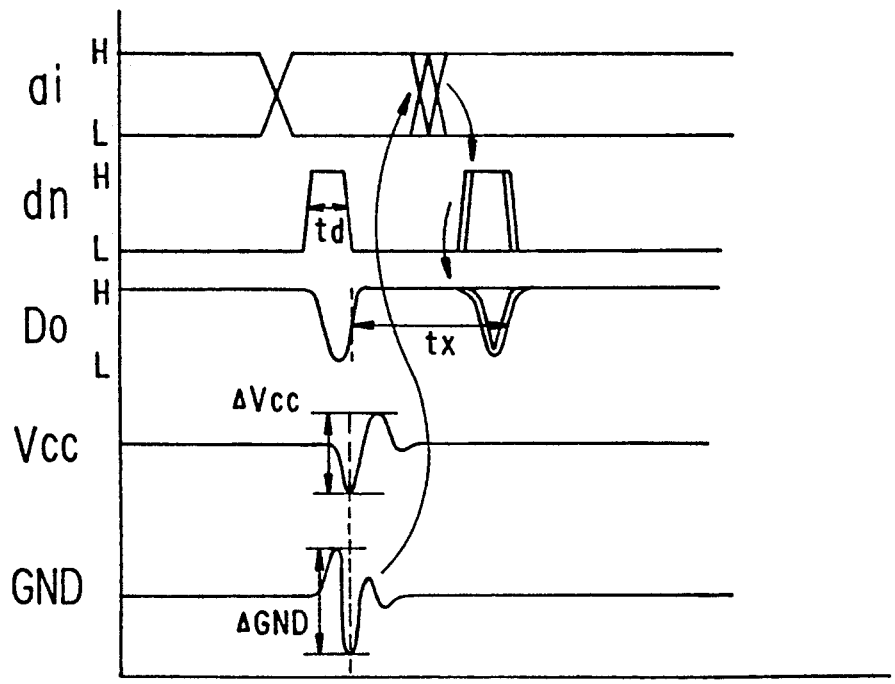

However, if the occurrence time difference is small as shown in FIG. 3, the negative peaks of the potential changes ΔGND and ΔVcc are added to be amplified to a substantial extent. Then, this amplified potential change is applied to the address buffer 100Y, so that a wrong address is generated to read data of the wrong address from the memory 106 subsequently to the readout of data from a correct address of the memory 106 for a time "tx", as shown in FIG. 3. This causes a delay of the data output in the conventional semiconductor memory apparatus.

Figure 4:
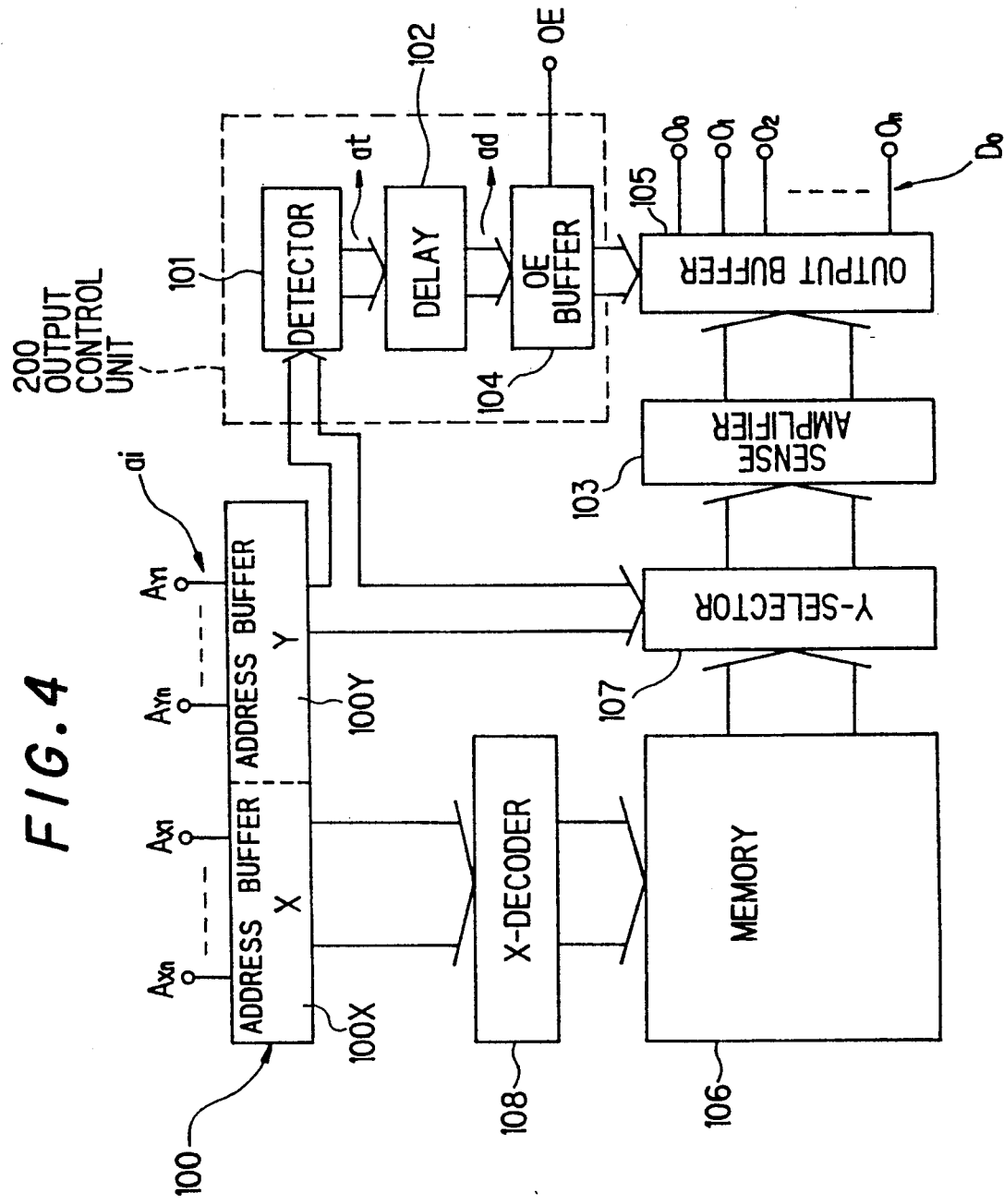
FIG. 4 is a block diagram showing a semiconductor memory apparatus of a preferred embodiment according to the invention.

Next, a semiconductor memory apparatus of a preferred embodiment according to the invention will be explained in conjunction with FIG. 4. A semiconductor memory apparatus includes an output control unit 200 additionally to other components corresponding with those of the conventional apparatus shown in FIG. 1, so that explanation of the corresponding structure and operation is omitted in this embodiment.

Figure 5:
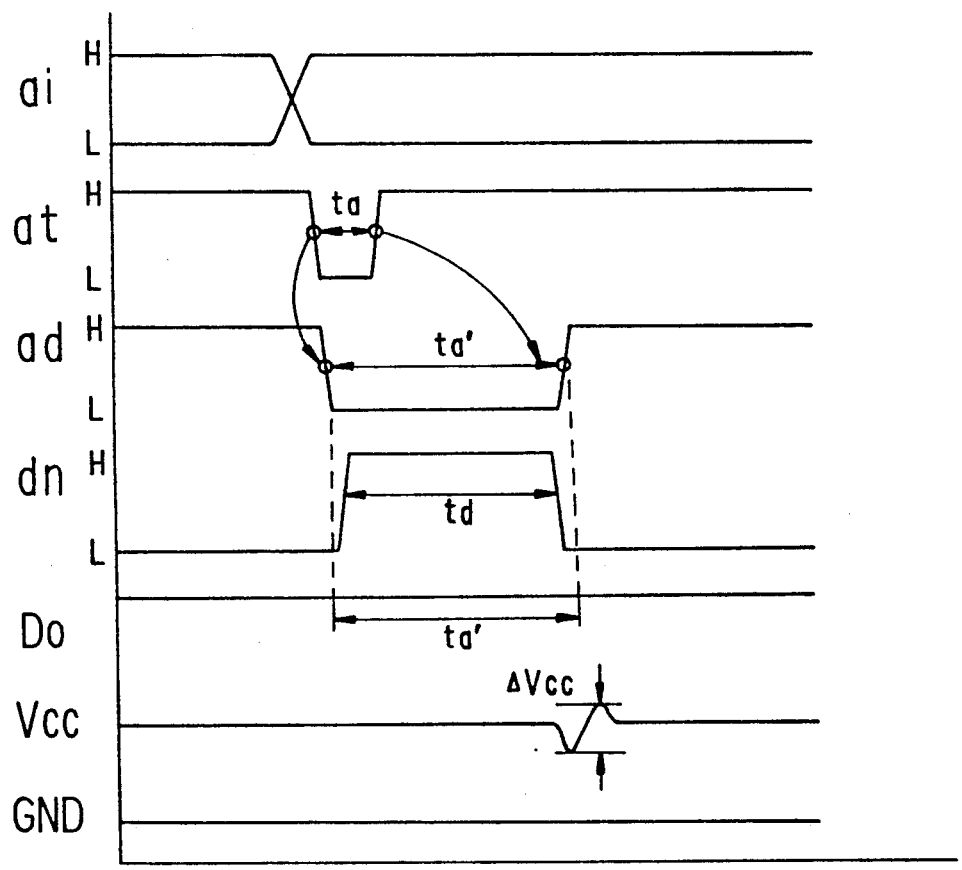
FIG. 5 is a timing chart showing operation of the preferred embodiment.

The output control unit 200 is composed of a detector 101 connected to a Y coordinate address buffer 100Y for detecting a change of Y coordinate address "ai" and supplying a detecting pulse signal "at", a delay circuit 102 connected to the detector 101 and supplies a delayed signal "ad", and an OE buffer 104 connected between the delay circuit 102 and an output buffer 105. A duration "ta'" of the delayed signal "ad" is determined to be wider than a duration "td" a false malfunction signal "dn" as shown in FIG. 5. The OE buffer 104 supplies a control signal to the output buffer 105 for keeping an output node of the output buffer 105 high impedance condition or OFF state.

Next, operation of the preferred embodiment will be explained in conjunction with FIG. 5. When an address signal is supplied to the address buffer 100, a Y coordinate address signal "ai" is supplied from the Y coordinate address buffer 100Y to the Y-selector 107 and the detector 101, respectively. Thus, the detector 101 detects a change of the Y coordinate address, and a detecting signal "at" is supplied from the detector 101 to the delay circuit 102 during a time "ta". In response to the detecting signal "at", the delay circuit 102 supplies a delay signal "ad" having a low duration "ta'" to the OE buffer 104, so that a control signal is supplied from the OE buffer 104 to the output buffer 105 for the time "ta'". Therefore, an output node of the output buffer 105 is kept to be high impedance condition or OFF state during the time "ta'". As the result, a wrong data is not supplied from the output buffer 105.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. A semiconductor memory apparatus comprising:
   a memory having memory cells arranged in a matrix pattern;
   means for addressing said memory in accordance with a given address signal;
   a sense amplifier for amplifying data read from said memory subsequently to a precharge of digit lines;
   buffer means for supplying said data to an external circuit;
   means for detecting a change of said given address signal to generate an address change signal; and
   means for controlling said buffer means to prohibit a supply of said data to said external circuit for a predetermined time in response to said address change signal,
   wherein said controlling means comprises a circuit for generating a prohibiting signal having a width of said predetermined time in response to said address change signal; and
   an output enabling buffer circuit for turning said buffer means into a high impedance state in response to said prohibiting signal.

2. A semiconductor memory apparatus, comprising:
   a memory having memory cells arranged in a matrix pattern;
   means for addressing said memory in accordance with a given address signal;
   a sense amplifier for amplifying data read from said memory subsequently to a precharge of digit lines;
   buffer means for supplying said data to an external circuit;
   means for detecting a change of said given address signal to generate an address change signal; and
   means for controlling said buffer means to prohibit a supply of said data to said external circuit for a predetermined time in response to said address change signal;
   wherein said controlling means comprises a circuit for generating a prohibiting signal having a width of said predetermined time in response to said address change signal; and
   an output enabling buffer circuit for turning said buffer means into an off state in response to said prohibiting signal.

* * * * *